United States Patent
Wu et al.

(10) Patent No.: US 10,083,140 B2
(45) Date of Patent: Sep. 25, 2018

(54) DRAM DATA PATH SHARING VIA A SEGMENTED GLOBAL DATA BUS

(71) Applicant: INTEL CORPORATION, Santa Clara, CA (US)

(72) Inventors: Wei Wu, Portland, OR (US); Shigeki Tomishima, Portland, OR (US); Shih-Lien L. Lu, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 147 days.

(21) Appl. No.: 14/975,305

(22) Filed: Dec. 18, 2015

(65) Prior Publication Data

US 2017/0177526 A1   Jun. 22, 2017

(51) Int. Cl.
| | |
|---|---|
| G06F 13/36 | (2006.01) |
| G06F 13/40 | (2006.01) |
| G06F 13/16 | (2006.01) |
| G11C 11/4091 | (2006.01) |
| G11C 11/4093 | (2006.01) |
| G11C 5/02 | (2006.01) |
| G11C 5/06 | (2006.01) |
| G11C 7/06 | (2006.01) |
| G11C 7/10 | (2006.01) |

(52) U.S. Cl.
CPC ...... *G06F 13/4022* (2013.01); *G06F 13/1668* (2013.01); *G11C 5/025* (2013.01); *G11C 5/063* (2013.01); *G11C 7/06* (2013.01); *G11C 7/1048* (2013.01); *G11C 11/4091* (2013.01); *G11C 11/4093* (2013.01); *G11C 2207/105* (2013.01); *G11C 2207/107* (2013.01)

(58) Field of Classification Search
CPC .................................................. G06F 13/1668
See application file for complete search history.

(56) References Cited

U.S. PATENT DOCUMENTS

| | | |
|---|---|---|
| 5,822,261 A | 10/1998 | Suh |
| 5,831,924 A | 11/1998 | Nitta et al. |
| 6,144,577 A | 11/2000 | Hidaka |

(Continued)

FOREIGN PATENT DOCUMENTS

WO   20060019870   2/2006

OTHER PUBLICATIONS

International Search Report and Written Opinion for International Application No. PCT/US2016/062849, dated Mar. 9, 2017, 12 pp. [(ISR & WO)].

(Continued)

*Primary Examiner* — Steven Snyder
*Assistant Examiner* — Juanito Borromeo
(74) *Attorney, Agent, or Firm* — Konrad Raynes Davda & Victor LLP; Rabindranath Dutta

(57) ABSTRACT

Provided are a memory device and a memory bank comprised of a local data bus, a segmented global data bus coupled to the local data bus, and a section select switch that is configurable to direct a signal from the local data bus to either end of the segmented global data bus. Provided also is a computational device comprising a processor and the memory device and optionally a display. Provided also is a method in which a signal is received from a local data bus, and a section select switch is configured to direct the signal from the local data bus to either end of a segmented global data bus.

25 Claims, 7 Drawing Sheets

(56) References Cited

U.S. PATENT DOCUMENTS

| | | | |
|---|---|---|---|
| 6,442,078 | B1 | 8/2002 | Arimoto |
| 6,754,120 | B1 | 6/2004 | Bellows et al. |
| 6,825,836 | B1 | 11/2004 | Stewart et al. |
| 2002/0054525 | A1 | 5/2002 | Eto et al. |
| 2004/0073745 | A1 | 4/2004 | Ma et al. |
| 2004/0170075 | A1 | 9/2004 | Suh |
| 2005/0047255 | A1 | 3/2005 | Park et al. |
| 2005/0289409 | A1 | 12/2005 | Smola et al. |
| 2007/0071130 | A1* | 3/2007 | Saito .................. G11C 7/04 375/318 |
| 2007/0073980 | A1 | 3/2007 | Chung |
| 2008/0048727 | A1* | 2/2008 | Yuan .................. G11C 7/02 327/51 |
| 2008/0278891 | A1 | 11/2008 | Bidenbach et al. |
| 2008/0291763 | A1 | 11/2008 | Mori et al. |
| 2009/0019199 | A1 | 1/2009 | Chun |
| 2012/0284552 | A1 | 11/2012 | Archer, Jr. et al. |
| 2013/0337646 | A1* | 12/2013 | Cernea .............. H01L 45/1608 438/666 |

OTHER PUBLICATIONS

International Search Report and Written Opinion for International Application No. PCT/US2016/062853, dated Mar. 9, 2017, 13 pp. [(ISR & WO)].
Davis, B.T., "Modern DRAM Architectures", Dissertation, University of Michigan, 2001, 236 pp.
JEDEC Solid State Technology Association, "DDR4 SDRAM", JEDEC Standard, JESD79-4, Sep. 2012, 214 pp.
JEDEC Solid State Technology Association, "High Bandwidth Memory (HBM) DRAM", JEDEC Standard, JESD235, Oct. 2013, 124 pp.
JEDEC Solid State Technology Association, "Low Power Double Data Rate 4 (LPDDR4)", JEDEC Standard, JESD209-4, Aug. 2014, 196 pp.
JEDEC Solid State Technology Association, "Wide I/O 2 (WideIO2)", JEDEC Standard, JESD229-2, Aug. 2014, 116 pp. [Submitted as Parts A, B, and C due to EFS-Web file size restrictions].
Techopedia, "Dynamic Random Access Memory (DRAM)", [online], [Retrieved on Nov. 20, 2015], Retrieved from the Internet at <URL: https://www.techopedia.com/definition/2770/dynamic-random-access-memory-dram>, 2 pp.
Yoo, J., et al., "A 32-Bank 1 GB Self-Strobing Synchronous DRAM with 1 GByte/s Bandwidth", IEEE Journal of Solid-State Circuits, vol. 31, No. 11, Nov. 1996, 10 pp.
U.S. Appl. No. 14/975,293, "DRAM Data Path Sharing Via a Split Local Data Bus and a Segmented Global Data Bus", by W. Wu et al., filed Dec. 18, 2015, 39 pp.
U.S. Appl. No. 14/975,298, "DRAM Data Path Sharing Via a Split Local Data Bus", by W. Wu et al., filed Dec. 18, 2015, 30 pp.
Written Opinion of the International Searching Authority, dated Mar. 3, 2017, for International Application No. PCT/US2016/062834, Total 11 pages.
International Search Report, dated Mar. 3, 2017, for International Application No. PCT/US2016/062834, Total 3 pages.
Notification of Transmittal of International Search Report, dated Mar. 3, 2017, for International Application No. PCT/US2016/062834, Total 2 pages.
Office Action 1 for U.S. Appl. No. 14/975,298, dated Jun. 29, 2017, 19 pp.
Response to Office Action 1 for U.S. Appl. No. 14/975,298, dated Sep. 29, 2017, 12 pp.
Office Action 1 for U.S. Appl. No. 14/975,293, dated Jul. 25, 2017, 25 pp.
Response to Office Action 1 for U.S. Appl. No. 14/975,293, dated Oct. 25, 2017, 10 pp.
Notice of Allowance 1 for U.S. Appl. No. 14/975,298, dated Nov. 22, 2017, 15 pp.
Notice of Allowance 1 for U.S. Appl. No. 14/975,293, dated Jan. 12, 2018, 17 pp.
U.S. Appl. No. 15/940,811, entitled "DRAM Data Path Sharing Via a Split Local Data Bus", filed Mar. 29, 2018, Invented by W. Wu et al., 30 pp.
International Preliminary Report on Patentability for International Application No. PCT/US2016/062834, dated Jun. 28, 2018, 13 pp.
Office Action 1 for U.S. Appl. No. 15/940,811, dated Jun. 14, 2018, 17 pp.
International Preliminary Report on Patentability for International Application No. PCT/US2016/062849, dated Jun. 28, 2018, 10 pp.
International Preliminary Report on Patentability for International Application No. PCT/US2016/062853, dated Jun. 28, 2018, 10 pp.

* cited by examiner

DRAM DATA PATH SHARING VIA A SEGMENTED GLOBAL DATA BUS

BACKGROUND

Dynamic Random Access Memory (DRAM) is a data storage device that is used in many different types of computational devices. Some DRAM chips are comprised of rectangular arrays of memory cells referred to as banks. Each bank has support logic that is used for reading and writing data in the bank, and refresh circuitry to maintain the integrity of the data stored in the bank. The banks may operate independently but may share command, address, and data pins. Each bank may be comprised of a hierarchical structure with rectangular arrays of memory cells. The contents stored in memory cells are addressed via word lines and bit lines. The intersection of a word line and a bit line constitutes the address of a memory cell.

BRIEF DESCRIPTION OF THE DRAWINGS

Referring now to the drawings in which like reference numbers represent corresponding parts throughout.

DETAILED DESCRIPTION

Figure 1:
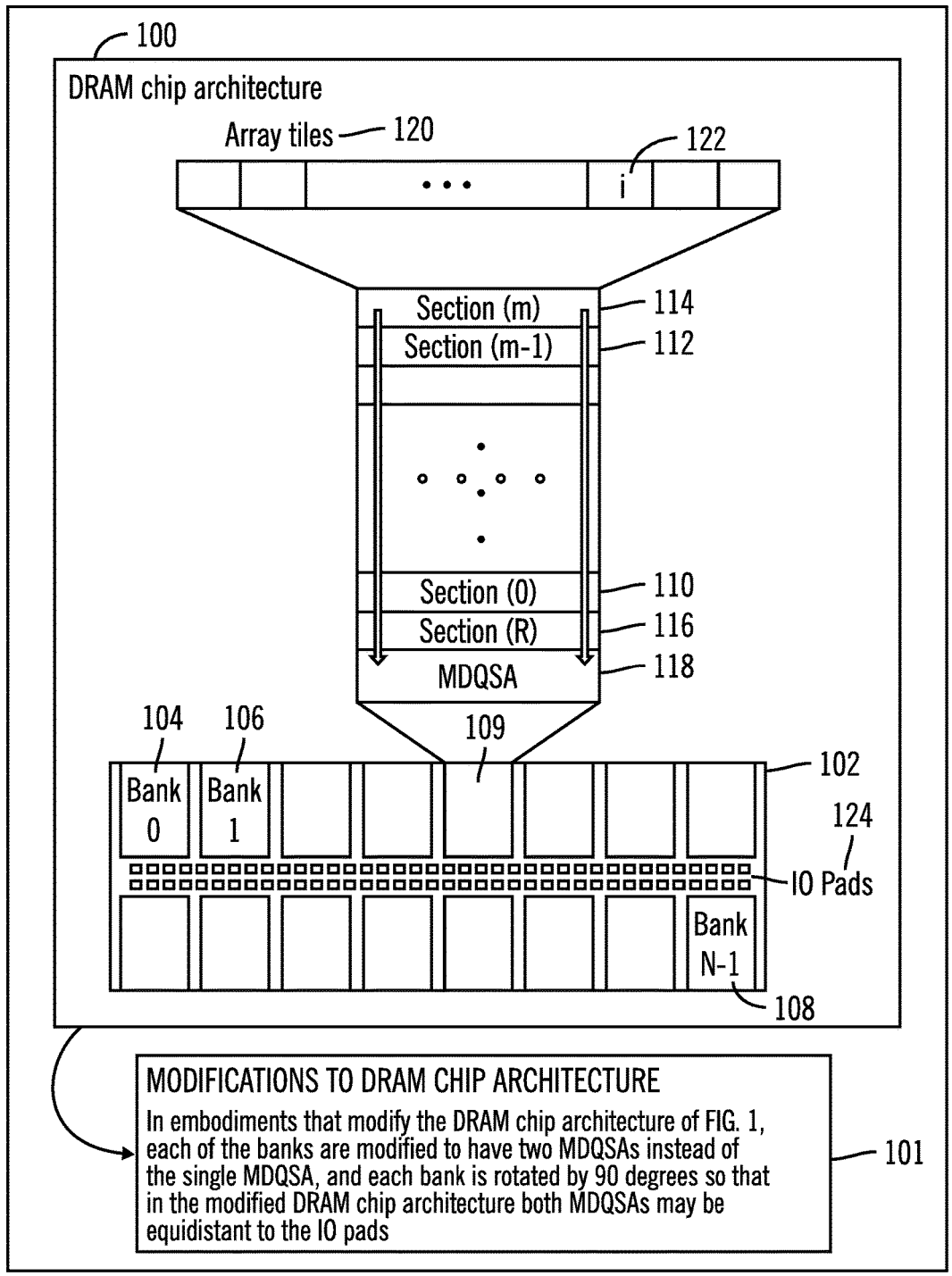
FIG. 1 illustrates a block diagram of a DRAM chip architecture and certain modifications to the DRAM chip architecture, in accordance with certain embodiments.

In certain DRAM chip architectures, when cells are sensed by bitline sense amplifiers, the sensed values are propagated to a local data bus, and then they are propagated through switches to a global data bus. The two data buses may extend in orthogonal directions and across an entire bank of the DRAM chip. No matter how far or close a cell is located from global sense amplifiers, the entire data path is occupied as the global sense amplifiers are all connected to one end of the global data bus. This is inefficient in terms of area utilization in the DRAM chip, as for about approximately 50% of the time, about half of the data path is idle. It is also timing inefficient because for the other approximately 50% of the time, the signal has to cross a long distance to reach the global sense amplifiers.

As the workload and speed of computer systems increase, higher bandwidth may be desirable in DRAMs. For increasing the bandwidth of DRAMs, certain embodiments address the routing of global input/output (IO) and local IO within the DRAM architecture. Although various embodiments are described with respect to DRAM, embodiments can be applied to any memory devices or devices that propagate values.

One example of dynamic volatile memory includes DRAM (dynamic random access memory), or some variant such as synchronous DRAM (SDRAM). A memory subsystem as described herein may be compatible with a number of memory technologies, such as DDR4 (DDR version 4, initial specification published in September 2012 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5 (LPDDR version 5, currently in discussion by JEDEC), HBM2 (HBM version 2, currently in discussion by JEDEC), and/or others, and technologies based on derivatives or extensions of such specifications.

In addition to, or alternatively to, volatile memory, in one embodiment, reference to memory devices can refer to a nonvolatile memory device whose state is determinate even if power is interrupted to the device. In one embodiment, the nonvolatile memory device is a block addressable memory device, such as NAND or NOR technologies. Thus, a memory device can also include a future generation nonvolatile devices, such as a three dimensional crosspoint memory device, or other byte addressable nonvolatile memory devices. In one embodiment, the memory device can be or include memory devices that use chalcogenide phase change material (e.g., chalcogenide glass), multi-threshold level NAND flash memory, NOR flash memory, single or multi-level Phase Change Memory (PCM), a resistive memory, nanowire memory, ferroelectric transistor random access memory (FeTRAM), magnetoresistive random access memory (MRAM) memory that incorporates memristor technology, or spin transfer torque (STT)-MRAM, a spintronic magnetic junction memory based device, or a combination of any of the above, or other memory.

Descriptions herein referring to a "DRAM" can apply to any memory device that allows random access, whether volatile or nonvolatile. The memory device or DRAM can refer to the die itself and/or to a packaged memory product.

In certain embodiments, global sense amplifiers are placed on both ends of the global data bus. The local data bus signals coming from top and bottom bitline sense amplifiers are transmitted to proceed along different directions in the global data bus. As a result, the local data bus signals are able to share the same global data bus track without overlapping.

In the following description, reference is made to the accompanying drawings which form a part hereof and which illustrate several embodiments. It is understood that other embodiments may be utilized and structural and operational changes may be made.

FIG. 1 illustrates a block diagram that shows a DRAM chip architecture 100 and certain modifications to the DRAM chip architecture (shown via reference numeral 101), in accordance with certain embodiments. The organization of memory banks in the DRAM chip architecture 100 is shown in a DRAM chip 102. The DRAM chip 102 is comprised of a plurality of banks numbered from 0 to (N−1), where Bank 0, Bank 1, and Bank 'N−1' are shown via reference numerals 104, 106, 108 respectively.

Each bank is comprised of a plurality of sections that may be referred to as sub-banks or sub-arrays. In FIG. 1, an exemplary bank 109 is shown to have sections 0. . . , (m−1), m, wherein section 0, section (m−1), and section (m) are shown via references numerals 110, 112, 114 respectively. In addition to the sections 0. . . m−1, m, the bank 109 is also comprised of a redundant section (R) 116 and circuitry for a main data queue sense amplifier (MDQSA) 118, where the MDQSA is a global sense amplifier that senses and amplifies signals.

Each of the sections 110 . . . 114 are comprised of a plurality of array tiles 120, where an exemplary array tile 'i' is shown via reference numeral 122.

In the DRAM chip architecture 100, the banks 0. . . (N−1) are shown in a certain configuration relative to the input/output (IO) pads 124. In the DRAM chip architecture 100, each bank is shown to have one MDQSA. Block 101 of FIG. 1 shows certain modifications that may be made to the DRAM chip architecture 100. In certain embodiments that modify the DRAM chip architecture 100 (the modifications are indicated via reference numeral 101), each of the banks 0. . . (N−1) of the DRAM chip architecture 100 are modified to have two MDQSAs instead of the one MDQSA shown in the DRAM chip architecture 100, and each bank shown in the DRAM chip architecture 100 is rotated by 90 degrees, such that in the modified DRAM chip architecture both MDQSAs may be equidistant to the I/O pads 124.

Therefore, FIG. 1 shows a DRAM chip architecture with a plurality of banks, each of which has a number of sections. Each section is segmented into a plurality of array tiles.

Figure 2:
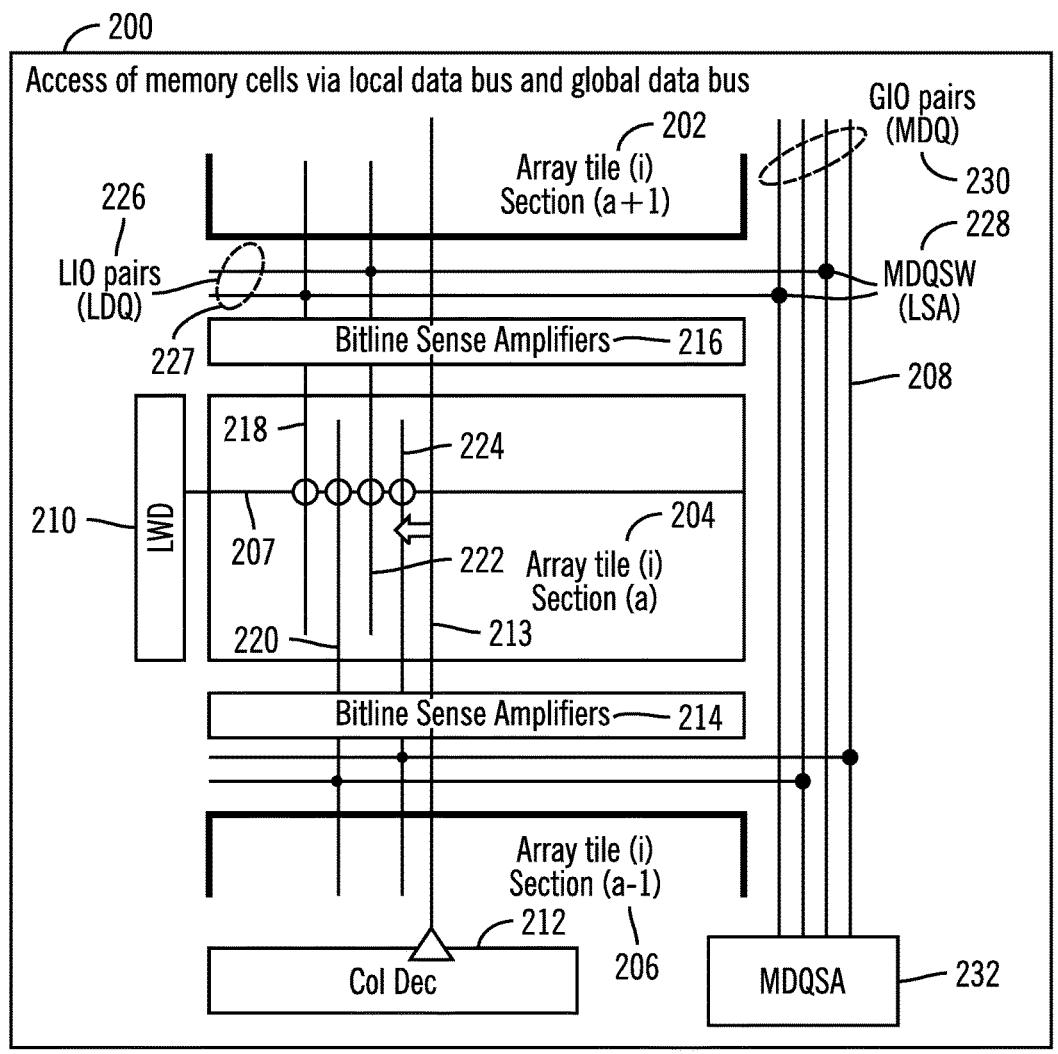
FIG. 2 illustrates a block diagram that shows access of memory cells via local data bus and global data bus, in accordance with certain embodiments.

FIG. 2 illustrates a block diagram 200 that shows access of memory cells via local data bus and global data bus, in accordance with certain embodiments. FIG. 2 shows array tile (i) (shown in FIG. 1 via reference numeral 122) of sections (a+1), a, and (a−1) via reference numerals 202, 204, 206. Thus in FIG. 2, the array tile (i) corresponding to three consecutive sections of a bank of the DRAM chip 102 are shown.

In FIG. 2, the horizontal lines show word lines and the vertical lines show bit lines. For example, reference numeral 207 shows an exemplary word line, and reference numeral 208 shows an exemplary bit line. In order to perform a prefetch, a local word line driver (LWD) 210 is activated and the column decoder 212 selects (via a column select line (CSL) 213) one or more bits from the word line.

The bitline sense amplifiers (BLSA) 214, 216 sense and amplify signals on the bit lines. Bitline sense amplifiers 216 are used in between section a and section (a+1), and bitline sense amplifiers 214 are used in between section (a−1) and section a. Bitline sense amplifiers, positioned above a section and a below a section, sense and amplify alternating bit lines. For example, if the bitline sense amplifiers 216 are used for even numbered bit lines, then the bitline sense amplifiers 214 are used for odd numbered bit lines. In FIG. 2, the bitline sense amplifiers 214 are used to sense and amplify signals in even numbered bit lines 220, 224 and the bitline sense amplifiers 216 are used to sense and amplify signals in odd numbered bit lines 218, 222. Each bitline sense amplifier is shared between two sections and if used for one section, the bitline sense amplifier is not used at the same time for another section.

When cells are sensed by bitline sense amplifiers, the sensed values are connected to a local data bus (LDQ or local data queue) 226 and then through switches, referred to as main data queue switch (MDQSW) 228, the sensed values are connected to the global data bus, referred to as main data queue (MDQ) 230. LDQ 226 may be referred to as local input/output (LIO) pair and the MDQ 230 may be referred to as global input/output (GIO) pair. The MSQSW 228 is shared by all sections whereas LDQ 226 is shared by two sections. The dotted oval 227 shows the two lines of the LDQ 226, where the two lines of the LDQ 226 are shared by section (a) and section (a+1), and the MDQSW 228 is shared by sections (a−1), section (a), section (a+1) and other sections not shown explicitly in FIG. 2.

Since the signals travel over long paths of the MDQ, main data queue sense amplifiers (MDQSA) 232 may be used to sense and amplify signals on the MDQ 230. Therefore, a local bus (shown via horizontal lines) is associated with each section and the MDQSW 228 determines, for the global data bus, where the signal is coming from.

Therefore, in FIG. 2, each array tile has a local word line driver. After a word line is activated, the column decoder 212 may trigger column select (CSL) to decide which bits should access the local IO bus (LDQ) 226. To pursue the smaller cell size, open-bitline architecture may be used in high-density memory cell array. There are two sets of BLSA 214, 216, one on the top and one at the bottom of a selected array tile. The horizontal LDQs are then connected to vertical global IO pairs (MDQ) 230 through the switches and local sense amplifiers referred to as MDQSW or LSA 228.

As illustrated in FIG. 2, to access 4 bits from an array tile uses 4 LDQ tracks (each track has two signal lines) and 4 MDQ tracks. In some architectures, the multiple MDQs may be allocated at both sides of the array tile or even stretch across two array tiles. However, the number of tracks is the same as shown in FIG. 2. It may be noted, that usually one column select operation selects 8 bits but for illustrative purposes FIG. 2 shows 4 bits being selected. Embodiments may use any number of bits for input/output.

Figure 3:
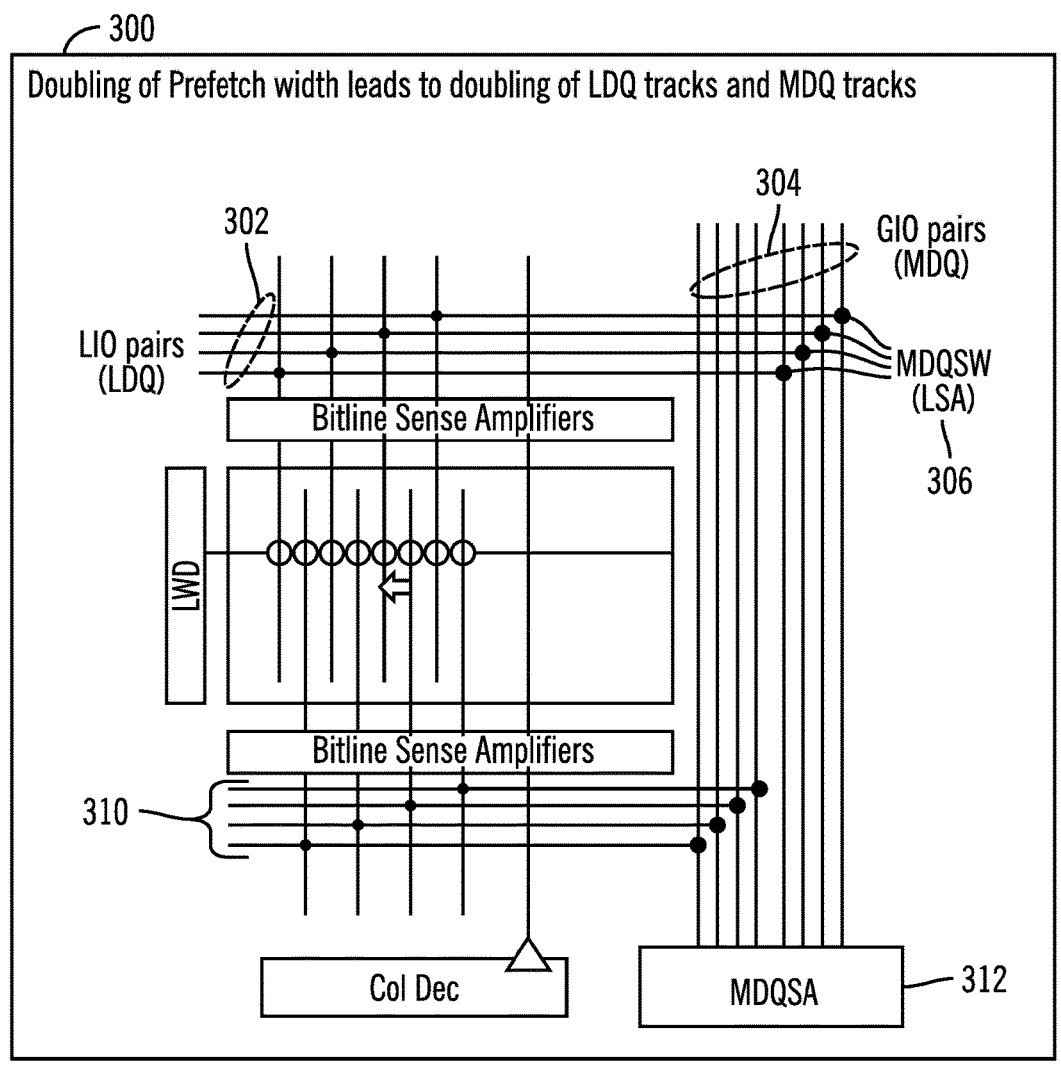
FIG. 3 illustrates a block diagram that shows that when prefetch width doubles then the number of local data bus tracks and the number of global data bus tracks double, in accordance with certain embodiments.

FIG. 3 illustrates a block diagram 300 that shows that when prefetch width doubles (in comparison to FIG. 2) then the number of LDQ tracks 302, the number of MDQ tracks 304, and the number of MDQSWs 306 double, in accordance with certain embodiments. For example, it can be seen that the 4 upper LDQs 302 and the 4 lower LDQs 310 share tracks. Eight signals go down via the MDQ tracks 304 to the MDQSA 312. This is not a desirable situation because the doubling of the prefetch width leads to a doubling (in comparison of FIG. 2) of at least the number of tracks of the global data bus.

Figure 4:
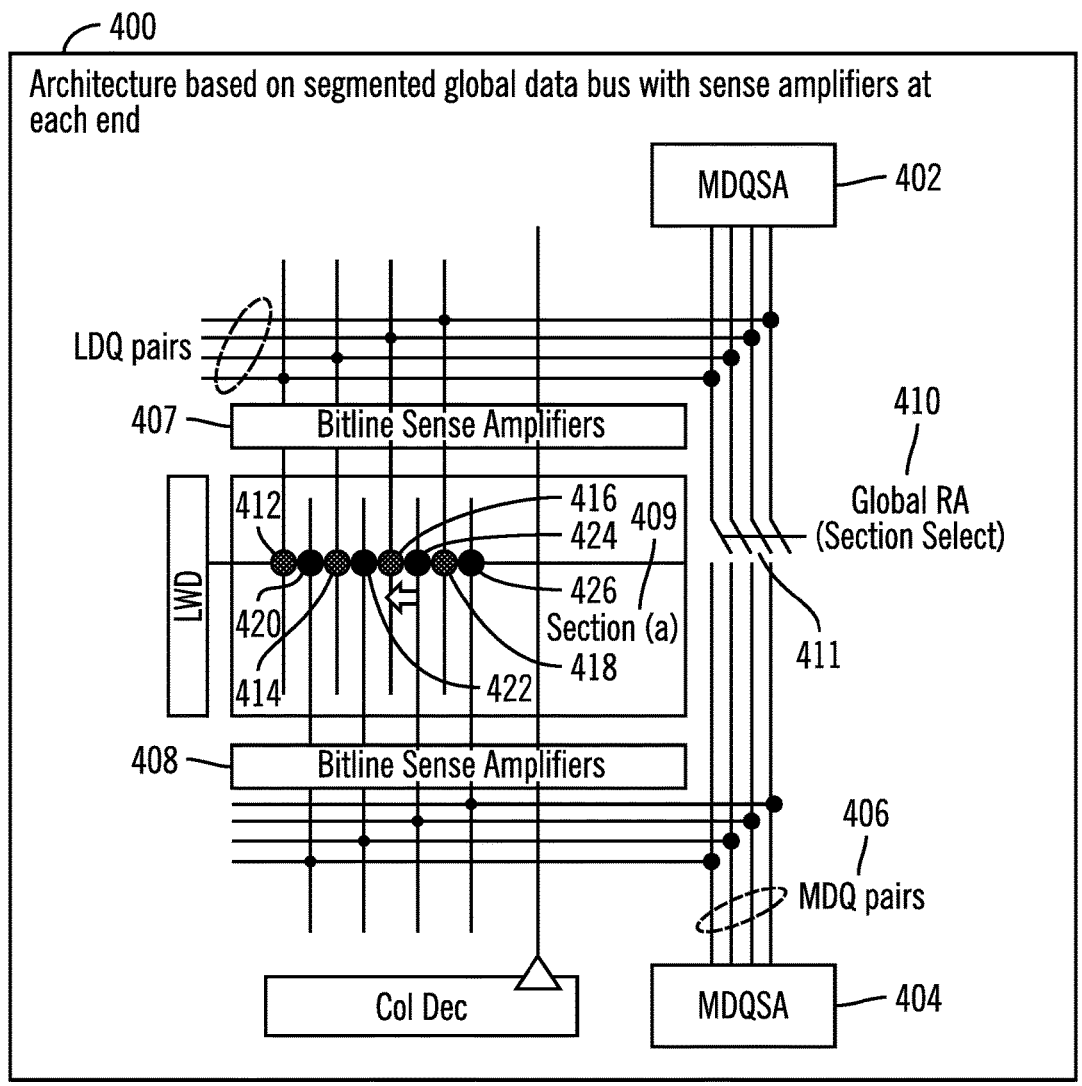
FIG. 4 illustrates a block diagram that shows a segmented global data bus with sense amplifiers at each end, in which even if the prefetch width doubles, the number of global data bus tracks remain unchanged, in accordance with certain embodiments.

FIG. 4 illustrates a block diagram 400 that shows a segmented MDQ with sense amplifiers at each end in which even if the prefetch width doubles, the number of MDQ tracks remains unchanged, in accordance with certain embodiments.

In the architectures shown in FIGS. 2 and 3, the global sense amplifiers are all connected to one end of the MDQ. In the architecture shown in FIG. 4, global sense amplifiers (MDQSA) 402, 404 are placed on both ends of the MDQ 406.

Figure 5:
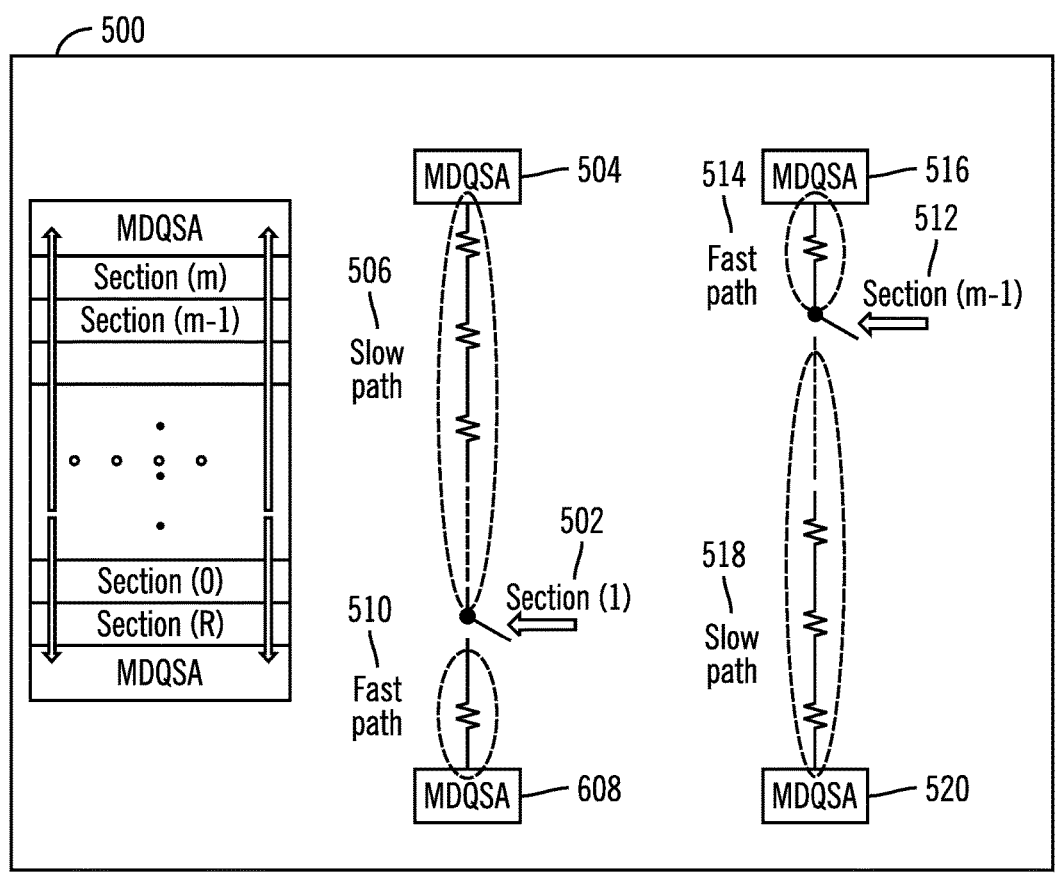
FIG. 5 illustrates a block diagram that shows how an entire global data bus line provides a slow path and a fast path for data, in accordance with certain embodiments.

A switch 410 is inserted in the MDQ tracks 406. This switch 410 is controlled by Global Row Address (RA), which selects the section for transmission of signal. In FIG. 4, the switch 410 may be used to break the MDQ tracks 406 adjacent to section (a) 409 into two groups by dividing the MDQ tracks 406 into two segments at the location indicated via reference numeral 411. The locations of divisions at 411 could be half way between the two MDQSAs 402, 404, although other locations can be used. For example, the description with regard to FIG. 5 provides at least some examples of locations of the division at 411. Reference herein to half or halves can refer to a portion less than or greater than a half.

As the MDQ tracks 406 are divided into two groups because of the segmentation of the MDQ tracks 406 at location 411 made by the switch 410, the LDQ signals coming from top BLSA 407 and bottom BLSA 408 may proceed to different directions and may share the same MDQ track without overlapping. For example, the memory cells 412, 414, 416, 418 indicated via cross hatching show LDQ signals proceeding in the upward direction, whereas the memory cells 420, 422, 424, 426 indicated via dark shading show LDQ signals proceeding in the downward direction. Although, reference is made to upwards and downwards, other directions can be used.

Therefore, certain embodiments separate the LDQ signals, by separating MDQSA on both ends of the MDQ. The signals from top BLSA 407 go to the top MDQSA 402, and signals from bottom BLSA 408 go to the bottom MDQSA 404 based on the operations of the switch 410 inserted in the MDQ line 406.

Therefore, the switch 410 divides the MDQ tracks 406 into two segments that are not connected. As a result, 8 bits of information may be sent at the same time along different paths on the 4 lines of the global data bus. Splitting a global data bus sends signal upwards and downwards, or along electrically isolated lines, at the same time. As a result, in FIG. 4 the output data is doubled without changing the number of tracks of the global data bus shown in FIG. 2.

FIG. 5 illustrates a block diagram 500 that shows an example of an entire MDQ data line. MDQ data line provides a slow path and a fast path for data, in accordance with certain embodiments. FIG. 5 shows examples of the MDQ data line. Each MDQ includes multiple switches, with one switch per section. Only the switch that corresponds to the section which is being accessed is used for segmenting the MDQ data line at a location adjacent to the section.

If the switch is used for segmenting the MDQ line adjacent to section (1) 502 on the global data bus, then data from one local data bus moves to the top MDQSA 504 via the slow path 506 of the global data bus, and data from another local data bus moves to the bottom MDQSA 508 via the fast path 510 of the global data bus. The term "slow path" signifies that the time a signal takes to proceed to the MDQSA along the path of the global data bus is relatively slow compared to the fast path (because the length of the path along the global data bus via which the signal proceeds to the MDSQA is longer than a length of the "fast" path along the global data bus). The term "fast path" signifies that the time a signal takes to proceed the MDQSA along the path of the global data bus is relatively fast compared to the slow path (because the length of the path along the global data bus via which the signal proceeds to the MDSQA is shorter than a length of the "slow" path along the global data bus). Thus data may be rapidly conveyed to at least one of the MDQ-SAs 504, 508.

However, if the switch is used for segmenting the global data bus adjacent to section (m−1) 512, then the fast path 514 is to the top MDQSA 516 (which is same as MDQSA 504) and the slow path 518 is to the bottom MDQSA 520 (which is same as MDQSA 508). It should be noted that as shown earlier in FIG. 4, that if the segmentation of the global data bus via the switch is adjacent to a selected section, then signals from the BLSA above the selected section follow the path to the top MDQSA whereas signals from the BLSA below the selected section follow the path to the bottom MDQSA. If the selected section is more towards the top MDQSA than the bottom MDQSA then signals from the BLSA above the selected section follow the fast path to the top MDQSA, whereas signals from the BLSA below the selected section follow the slow path to the bottom MDQSA. Similarly, if the selected section is more towards the bottom MDQSA than the top MDQSA, then signals from the BLSA above the selected section follow the slow path to the top MDQSA, whereas signals from the BLSA below the selected section follow the fast path to the bottom MDQSA. If the selected section is equidistant from the top MDQSA and the bottom MDQSA then the time taken by a signal from the BLSA above the selected section to proceed to the top MDQSA is the approximately the same as the time taken by a signal from the BLSA below the selected section to proceed to the bottom MDQSA.

Depending on the location of the section adjacent to which the switch is used to segment the global data bus, one path to an MDQSA may be faster than the other path to another MDQSA (as shown in FIG. 5). Signals that flow though fast paths and slow paths of the memory bank may have to be collected and combined outside the memory bank. In certain embodiments, the term "multiplexing" is used to refer to the selection of one half of signals first and the selection of the other half of signals afterwards, where one half of the signals are selected from one MDQSA (e.g., upper MDQSA 516) and the other half of the signals are selected from the other MDQSA (e.g., lower MDQSA 520). In certain embodiments, the selection of the signals may be via a "physical multiplexing" in which the two halves of signals share one output pin. In alternative embodiments, the selection may be via a "logical multiplexing" in which one half of the signals are enabled first and the other half of the signals are enabled later on. Therefore, in certain embodiments, the signals that proceed via the fast paths and the signals that proceed via the slow paths are multiplexed. In certain embodiments, the multiplexing first enables all the signals that proceed via the fast paths, and then enables all the signals that proceed via the slow paths. As a result, at least the signals that proceed via the fast paths may be processed earlier than the signals of the slow paths. In certain embodiments, if the latency of the slow paths are tolerable, the system may wait until all signals are ready, and multiplexing may be avoided.

Figure 6:
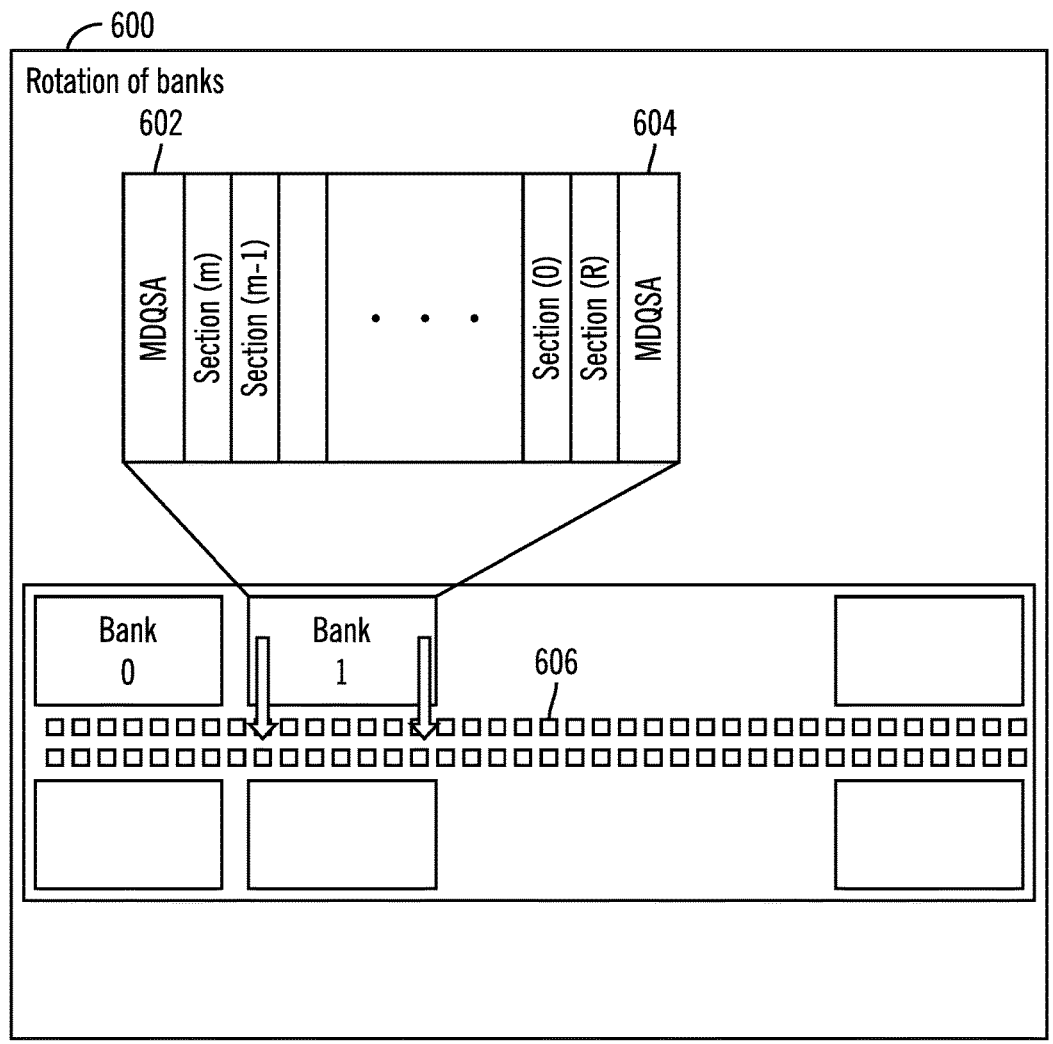
FIG. 6 illustrates a block diagram that shows rotation of banks in a DRAM chip architecture such that both global sense amplifiers may be equally distant to input/output (IO) pads, in accordance with certain embodiments.

FIG. 6 illustrates a block diagram 600 that shows rotation of banks in the architecture so that both MDQSA 602, 604 may be equally distant to IO pads 606, in accordance with certain embodiments. FIG. 6 shows the change for the chip architecture shown in FIGS. 1, 2 to implement certain embodiments. Since there are two groups of MDQSA in accordance with the embodiments shown in FIGS. 4 and 5, the two groups of MDQSA 602, 604 are both put close to the IO PADs 606, by rotating the banks shown in FIG. 1 by 90 degrees, so that both MDQSAs 602, 604 are equally distant to the IO pads 606. In FIG. 6, the narrower side of the rectangular array of cells are parallel to IO pads of the memory device but other types of embodiments are possible and the relative physical dimensions of the rectangular array of cells may be different from that shown in FIG. 6.

Therefore, certain embodiments shown in FIGS. 1-6 use sense amplifiers at both ends of the global data bus and use section select to transmit data through the global data bus. The bandwidth is increased by allowing transmission along shorter length lines and in parallel without increasing the number of global data bus lines.

The described components and/or operations may be implemented as a method, apparatus or computer program product using standard programming and/or engineering techniques to produce software, firmware, hardware, or any combination thereof. The described operations may be implemented as code maintained in a "computer readable storage medium" for implementation in certain embodiments or for software simulation of a memory chip for design purposes, where a processor may read and execute the code from the computer storage readable medium. The computer readable storage medium includes at least one of electronic circuitry, storage materials, inorganic materials, organic materials, biological materials, a casing, a housing, a coating, and hardware. A computer readable storage medium may comprise, but is not limited to, a magnetic storage medium (e.g., hard drive drives, floppy disks, tape, etc.), optical storage (CD-ROMs, DVDs, optical disks, etc.), volatile and non-volatile memory devices (e.g., EEPROMs, ROMs, PROMs, RAMs, DRAMs, SRAMs, Flash Memory, firmware, programmable logic, etc.), Solid State Devices (SSD), etc. The code implementing the described operations may further be implemented in hardware logic implemented in a hardware device (e.g., an integrated circuit chip, Programmable Gate Array (PGA), Application Specific Integrated Circuit (ASIC), etc.). Still further, the code implementing the described operations may be implemented in "transmission signals", where transmission signals may propagate through space or through a transmission media, such as an optical fiber, copper wire, etc. The transmission signals in which the code or logic is encoded may further comprise a wireless signal, satellite transmission, radio waves, infrared signals, Bluetooth, etc. The program code embedded on a computer readable storage medium may be transmitted as transmission signals from a transmitting station or computer to a receiving station or computer. A computer readable storage medium is not comprised solely of transmission signals. Those skilled in the art will recognize that many modifications may be made to this configuration, and that the article of manufacture may comprise suitable information bearing medium known in the art.

Computer program code for carrying out operations for aspects of the certain embodiments may be written in any combination of one or more programming languages. Blocks of flowcharts and/or block diagrams may be implemented by computer program instructions.

Figure 7:
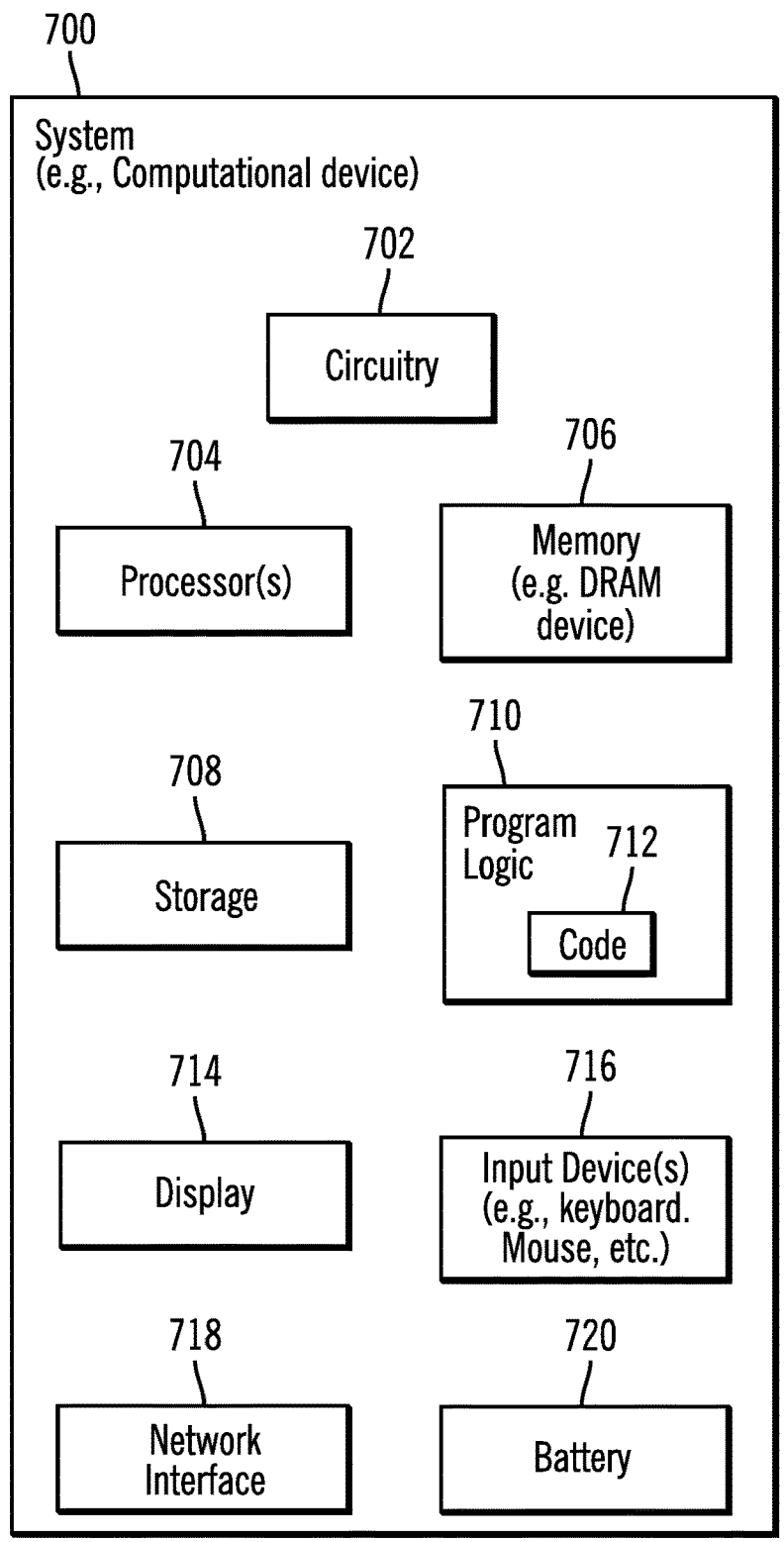
FIG. 7 illustrates a block diagram of a system including a computational device that includes a DRAM device, in accordance with certain embodiments.

FIG. 7 illustrates a block diagram of a system 700 that may include a computational device where a DRAM with a segmented MDQ with sense amplifiers at each end is included in the computational device. For example, in certain embodiments the system 700 may be a computer (e.g., a laptop computer, a desktop computer, a tablet, a cell phone or any other suitable computational device) that has a DRAM chip having the segmented MDQ with sense amplifiers at each end (as shown in FIG. 4) in the computer. The system 700 may include a circuitry 702 that may in certain embodiments include at least a processor 704. The system 700 may also include a memory 706 (e.g., a DRAM having a segmented MDQ with sense amplifiers at each end), and storage 708. The storage 708 may include a solid state drive, a disk drive, or other drives or devices including a non-volatile memory device (e.g., EEPROM, ROM, PROM, flash, firmware, programmable logic, etc.). The storage 708 may also include a magnetic disk drive, an optical disk drive, a tape drive, etc. The storage 708 may comprise an internal storage device, an attached storage device and/or a network accessible storage device. The system 700 may include a program logic 710 including code 712 that may be loaded into the memory 706 and executed by the processor 704 or circuitry 702. In certain embodiments, the program logic 710 including code 712 may be stored in the storage 708. In certain other embodiments, the program logic 710 may be implemented in the circuitry 702. Therefore, while FIG. 7 shows the program logic 710 separately from the other elements, the program logic 710 may be implemented in the memory 706 and/or the circuitry 702. The system 700 may also include a display 714 (e.g., an liquid crystal display (LCD), a light emitting diode (LED) display, a cathode ray tube (CRT) display, a touchscreen display, or any other suitable display). The system 700 may also include one or more input devices 716, such as, a keyboard, a mouse, a joystick, a trackpad, or any other suitable input devices). In certain embodiments, the display 714 may be coupled to a memory device comprising the storage 724 and/or the memory 706; a network interface 714 may be communicatively coupled to the processor 704; and a battery 720 may be communicatively coupled to the processor. Other components or devices beyond those shown in FIG. 7 may also be found in the system 700.

Certain embodiments may be directed to a method for deploying computing instruction by a person or automated processing integrating computer-readable code into a computing system, wherein the code in combination with the computing system is enabled to perform the operations of the described embodiments.

The terms "an embodiment", "embodiment", "embodiments", "the embodiment", "the embodiments", "one or more embodiments", "some embodiments", and "one embodiment" mean "one or more (but not all) embodiments" unless expressly specified otherwise.

The terms "including", "comprising", "having" and variations thereof mean "including but not limited to", unless expressly specified otherwise.

The enumerated listing of items does not imply that any or all of the items are mutually exclusive, unless expressly specified otherwise.

The terms "a", "an" and "the" mean "one or more", unless expressly specified otherwise.

Devices that are in communication with each other need not be in continuous communication with each other, unless expressly specified otherwise. In addition, devices that are in communication with each other may communicate directly or indirectly through one or more intermediaries.

A description of an embodiment with several components in communication with each other does not imply that all such components are required. On the contrary a variety of optional components are described to illustrate the wide variety of possible embodiments.

Further, although process steps, method steps, algorithms or the like may be described in a sequential order, such processes, methods and algorithms may be configured to work in alternate orders. In other words, any sequence or order of steps that may be described does not necessarily indicate a requirement that the steps be performed in that order. The steps of processes described herein may be performed in any order practical. Further, some steps may be performed simultaneously.

When a single device or article is described herein, it will be readily apparent that more than one device/article (whether or not they cooperate) may be used in place of a single device/article. Similarly, where more than one device or article is described herein (whether or not they cooperate), it will be readily apparent that a single device/article may be used in place of the more than one device or article or a different number of devices/articles may be used instead of the shown number of devices or programs. The functionality and/or the features of a device may be alternatively embodied by one or more other devices which are not explicitly described as having such functionality/features. Thus, other embodiments need not include the device itself.

At least certain operations that may have been illustrated in the figures show certain events occurring in a certain order. In alternative embodiments, certain operations may be performed in a different order, modified or removed. Moreover, steps may be added to the above described logic and still conform to the described embodiments. Further, operations described herein may occur sequentially or certain operations may be processed in parallel. Yet further, operations may be performed by a single processing unit or by distributed processing units.

The foregoing description of various embodiments has been presented for the purposes of illustration and description. It is not intended to be exhaustive or to be limited to the precise forms disclosed. Many modifications and variations are possible in light of the above teaching.

EXAMPLES

The following examples pertain to further embodiments.

Example 1 is a memory device comprising a local data bus, a segmented global data bus coupled to the local data bus, and a section select switch that is configurable to direct a signal from the local data bus to either end of the segmented global data bus.

In example 2, the subject matter of example 1 may include that the memory device is at least one of a volatile or a nonvolatile memory device.

In example 3, the subject matter of example 1 may include that the segmented global data bus comprises a first sense amplifier at one end and a second sense amplifier at another end.

In example 4, the subject matter of example 3 may include that each sense amplifier comprises a main data queue sense amplifier (MDQSA) to sense and amplify signals.

In example 5, the subject matter of example 3 may include that based on a section selected by the section select switch, a first signal follows a fast path to the one end and a second signal follows a slow path to the other end.

In example 6, the subject matter of example 5 may include that the memory device further comprises logic to first enable signals that proceed via the fast path and then enable signals that proceed via the slow path.

In example 7, the subject matter of example 3 may include that the first sense amplifier and the second sense amplifier are equidistant to input/output (IO) pads couplable to the memory device.

In example 8, the subject matter of example 1 may include that the local data bus, the segmented global data bus, and the section select switch are included in a memory bank with a rectangular array of cells.

In example 9, the subject matter of example 1 may include that the memory device comprises at least one memory bank.

Example 10 is a method comprising receiving a signal from a local data bus, and configuring a section select switch to direct the signal from the local data bus to either end of a segmented global data bus.

In example 11, the subject matter of example 10 may include that memory device is at least one of a volatile or a nonvolatile memory device.

In example 12, the subject matter of example 10 may include that the segmented global data bus comprises a first sense amplifier at one end and a second sense amplifier at another end.

In example 13, the subject matter of example 12 may include performing sensing and amplifying signals via each sense amplifier, wherein each sense amplifier comprises a main data queue sense amplifier (MDQSA).

In example 14, the subject matter of example 13 may include that based on a section selected by the section select switch, a first signal follows a fast path to the one end, and a second signal follows a slow path to the other end.

In example 15, the subject matter of example 14 may include first enabling signals that proceed via the fast path and then enabling signals that proceed via the slow path.

In example 16, the subject matter of example 12 may include that the first sense amplifier and the second sense amplifier are equidistant to input/output (IO) pads couplable to the memory device, wherein the local data bus, the segmented global data bus, and the section select switch are included in a memory bank with a rectangular array of cells.

Example 17 is a computational device, comprising a processor, and a memory device coupled to the processor, the memory device comprising a local data bus, a segmented global data bus coupled to the local data bus, and a section select switch that is configurable to direct a signal from the local data bus to either end of the segmented global data bus.

In example 18, the subject matter of example 17 may include that the memory device is at least one of a volatile or a nonvolatile memory device.

In example 19, the subject matter of example 17 may include that the segmented global data bus comprises a first sense amplifier at one end and a second sense amplifier at another end.

In example 20, the subject matter example 19 may include that each sense amplifier comprises a main data queue sense amplifier (MDQSA) to sense and amplify signals.

In example 21, the subject matter of example 20 may include that based on a section selected by the section select switch, a first signal follows a fast path to the one end and a second signal follows a slow path to the other end.

In example 22, the subject matter of example 21 may include logic to first enable signals that proceed via the fast path and then enable signals that proceed via the slow path.

In example 23, the subject matter of example 19 may include that the first sense amplifier and the second sense amplifier are equidistant to input/output (IO) pads couplable to the memory device.

In example 24, the subject matter of example 17 may include that the local data bus, the segmented global data bus, and the section select switch are included in a memory bank with a rectangular array of cells, wherein the memory device comprises at least one memory bank.

In example 25, the subject matter of example 17 may include that the computational device further comprises one or more of: a display coupled to the memory device; a network interface communicatively coupled to the processor; or a battery communicatively coupled to the processor.

Example 26 is a memory device for sharing of data path, the memory device comprising a local data bus, a segmented global data bus coupled to the local data bus, and a section select switch that is configurable to direct a signal from the local data bus to either end of the segmented global data bus.

In example 27, the subject matter of example 26 may include that the memory device is at least one of a volatile or a nonvolatile memory device.

In example 28, the subject matter of example 26 may include that the segmented global data bus comprises a first sense amplifier at one end and a second sense amplifier at another end.

In example 29, the subject matter of example 28 may include that each sense amplifier comprises a main data queue sense amplifier (MDQSA) to sense and amplify signals.

In example 30, the subject matter of example 28 may include that based on a section selected by the section select switch, a first signal follows a fast path to the one end and a second signal follows a slow path to the other end.

In example 31, the subject matter of example 30 may include that the memory device further comprises logic to first enable signals that proceed via the fast path and then enable signals that proceed via the slow path.

In example 32, the subject matter of example 28 may include that the first sense amplifier and the second sense amplifier are equidistant to input/output (IO) pads couplable to the memory device.

In example 33, the subject matter of example 26 may include that the local data bus, the segmented global data bus, and the section select switch are included in a memory bank with a rectangular array of cells.

In example 34, the subject matter of example 26 may include that the memory device comprises at least one memory bank.

Example 35 is a method for sharing of data path, the method comprising receiving a signal from a local data bus, and configuring a section select switch to direct the signal from the local data bus to either end of a segmented global data bus.

In example 36, the subject matter of example 35 may include that memory device is at least one of a volatile or a nonvolatile memory device.

In example 37, the subject matter of example 35 may include that the segmented global data bus comprises a first sense amplifier at one end and a second sense amplifier at another end.

In example 38, the subject matter of example 37 may include performing sensing and amplifying signals via each sense amplifier, wherein each sense amplifier comprises a main data queue sense amplifier (MDQSA).

In example 39, the subject matter of example 38 may include that based on a section selected by the section select switch, a first signal follows a fast path to the one end, and a second signal follows a slow path to the other end.

In example 40, the subject matter of example 39 may include first enabling signals that proceed via the fast path and then enabling signals that proceed via the slow path.

In example 41, subject matter of example 37 may further include that the first sense amplifier and the second sense amplifier are equidistant to input/output (IO) pads couplable to the memory device, wherein the local data bus, the segmented global data bus, and the section select switch are included in a memory bank with a rectangular array of cells.

Example 42 is a computational device for sharing of data path, the computational device comprising a processor, and a memory device coupled to the processor, the memory device comprising a local data bus, a segmented global data bus coupled to the local data bus, and a section select switch that is configurable to direct a signal from the local data bus to either end of the segmented global data bus.

In example 43, the subject matter of example 42 may include that the memory device is at least one of a volatile or a nonvolatile memory device.

In example 44, the subject matter of example 42 may include that the segmented global data bus comprises a first sense amplifier at one end and a second sense amplifier at another end.

In example 45, the subject matter example 44 may include that each sense amplifier comprises a main data queue sense amplifier (MDQSA) to sense and amplify signals.

In example 46, the subject matter of example 45 may include that based on a section selected by the section select switch, a first signal follows a fast path to the one end and a second signal follows a slow path to the other end.

In example 47, the subject matter of example 46 may include logic to first enable signals that proceed via the fast path and then enable signals that proceed via the slow path.

In example 48, the subject matter of example 44 may include that the first sense amplifier and the second sense amplifier are equidistant to input/output (IO) pads couplable to the memory device.

In example 49, the subject matter of example 42 may include that the local data bus, the segmented global data bus, and the section select switch are included in a memory bank with a rectangular array of cells, wherein the memory device comprises at least one memory bank.

In example 50, the subject matter of example 42 may include that the computational device further comprises one or more of: a display coupled to the memory device; a network interface communicatively coupled to the processor; or a battery communicatively coupled to the processor.

Example 51 is a system for sharing of data path, comprising: means for receiving a signal from a local data bus; and means for configuring a section select switch to direct the signal from the local data bus to either end of a segmented global data bus.

In example 52, the subject matter of example 51 may include that the memory device is at least one of a volatile or a nonvolatile memory device.

In example 53, the subject matter example 51 may include that the segmented global data bus comprises a first sense amplifier at one end and a second sense amplifier at another end.

In example 54, the subject matter of example 53 may include means for sensing and amplifying signals via each sense amplifier, wherein each sense amplifier comprises a main data queue sense amplifier (MDQSA).

In example 55, the subject matter of example 54 may include means for a first signal to follow a fast path to the one end, and a second signal to follow a slow path to the other end, based on a section selected by the section select switch.

In example 56, the subject matter of example 55 may include means for first enabling signals that proceed via the fast path and then enabling signals that proceed via the slow path.

In example 57, the subject matter of example 53 may include that the first sense amplifier and the second sense amplifier are equidistant to input/output (IO) pads couplable to the memory device, wherein the local data bus, the segmented global data bus, and the section select switch are included in a memory bank with a rectangular array of cells.

What is claimed is:
1. A memory device, comprising:
a first local data bus;
a second local data bus;
a global data bus; and
a section select switch that is configurable to divide the global data bus into a first segment and a second segment, wherein the first segment and the second segment are not connected, and wherein the section select switch is configurable to parallelly direct a first signal from the first local data bus to the first segment of the global data bus and a second signal from the second local data bus to the second segment of the global data bus, wherein the first local data bus, the second local data bus, and the global data bus have an equal number of tracks, and wherein a prefetch width of the memory device is twice of the equal number of tracks.

2. The memory device of claim 1, wherein the global data bus comprises a first sense amplifier at one end and a second sense amplifier at another end.

3. The memory device of claim 2, wherein each sense amplifier comprises a main data queue sense amplifier (MDQSA) to sense and amplify signals.

4. The memory device of claim 1, wherein based on a section selected by the section select switch, the first signal follows a fast path to one end of the global data bus via the first segment and the second signal follows a slow path to another end of the global data bus via the second segment.

5. The memory device of claim 4, comprising logic to first enable signals that proceed via the fast path and then enable signals that proceed via the slow path.

6. The memory device of claim 2, wherein the first sense amplifier and the second sense amplifier are equidistant to input/output (IO) pads couplable to the memory device.

7. The memory device of claim 1, wherein the first local data bus, the second local data bus, the global data bus, and the section select switch are included in a memory bank with a rectangular array of cells.

8. The memory device of claim 1, wherein the memory device comprises at least one memory bank.

9. A method, comprising:
receiving a first signal from a first local data bus of a memory device;
receiving a second signal from a second local data bus of the memory device; and
configuring a section select switch to divide a global data bus of the memory device into a first segment and a second segment, wherein the first segment and the second segment are not connected, and parallelly directing the first signal from the first local data bus to the first segment of the global data bus and the second signal from the second local data bus to the second segment of the global data bus, wherein the first local data bus, the second local data bus, and the global data bus have an equal number of tracks, and wherein a prefetch width of the memory device is twice of the equal number of tracks.

10. The method of claim 9, wherein the global data bus comprises a first sense amplifier at one end and a second sense amplifier at another end.

11. The method of claim 10, the method further comprising:
sensing and amplifying signals via each sense amplifier, wherein each sense amplifier comprises a main data queue sense amplifier (MDQSA).

12. The method of claim 9, the method further comprising:
based on a section selected by the section select switch, the first signal follows a fast path to one end of the global data bus via the first segment and the second signal follows a slow path to another end of the global data bus via the second segment.

13. The method of claim 12, the method further comprising:
first enabling signals that proceed via the fast path and then enabling signals that proceed via the slow path.

14. The method of claim 10, wherein the first sense amplifier and the second sense amplifier are equidistant to input/output (IO) pads couplable to the memory device, and wherein the first local data bus, the second local data bus, the global data bus, and the section select switch are included in a memory bank with a rectangular array of cells.

15. A computational device, comprising:
a processor; and
a memory device coupled to the processor, the memory device comprising:
a first local data bus;
a second local data bus;
a global data bus; and
a section select switch that is configurable to divide the global data bus into a first segment and a second segment, wherein the first segment and the second segment are not connected, and wherein the section select switch is configurable to parallelly direct a first signal from the first local data bus to the first segment of the global data bus and a second signal from the second local data bus to the second segment of the global data bus, wherein the first local data bus, the second local data bus, and the global data bus have an equal number of tracks, and wherein a prefetch width of the memory device is twice of the equal number of tracks.

16. The computational device of claim 15, wherein the global data bus comprises a first sense amplifier at one end and a second sense amplifier at another end.

17. The computational device of claim 16, wherein each sense amplifier comprises a main data queue sense amplifier (MDQSA) to sense and amplify signals.

18. The computational device of claim 15, wherein based on a section selected by the section select switch, the first signal follows a fast path to one end of the global data bus via the first segment and the second signal follows a slow path to another end of the global data bus via the second segment.

19. The computational device of claim 18, comprising logic to first enable signals that proceed via the fast path and then enable signals that proceed via the slow path.

20. The computational device of claim 16, wherein the first sense amplifier and the second sense amplifier are equidistant to input/output (IO) pads couplable to the memory device.

21. The computational device of claim 15, wherein the first local data bus, the second local data bus, the global data bus, and the section select switch are included in a memory bank with a rectangular array of cells, and wherein the memory device comprises at least one memory bank.

22. The computational device of claim 15, comprising one or more of:
a display coupled to the memory device;
a network interface communicatively coupled to the processor; or
a battery communicatively coupled to the processor.

23. The memory device of claim 1, further comprising:
a first set of bitline sense amplifiers configurable to direct the first signal via the first local data bus and the section select switch to the first segment; and
a second set of bitline sense amplifiers configurable to direct the second signal via the second local data bus and the section select switch to the second segment.

24. The method of claim 9, further comprising:
configuring a first set of bitline sense amplifiers to direct the first signal via the first local data bus and the section select switch to the first segment; and configuring a second set of bitline sense amplifiers to direct the second signal via the second local data bus and the section select switch to the second segment.

25. The computational device of claim 15, wherein the memory device further comprises:
a first set of bitline sense amplifiers configurable to direct the first signal via the first local data bus and the section select switch to the first segment; and
a second set of bitline sense amplifiers configurable to direct the second signal via the second local data bus and the section select switch to the second segment.

* * * * *